United States Patent
Goel et al.

(10) Patent No.: US 10,615,949 B2
(45) Date of Patent: Apr. 7, 2020

(54) HYBRID-BASED CANCELLATION IN PRESENCE OF ANTENNA MISMATCH

(71) Applicant: UNIVERSITY OF SOUTHERN CALIFORNIA, Los Angeles, CA (US)

(72) Inventors: Ankush Goel, San Jose, CA (US); Behnam Analui, Irvine, CA (US); Hossein Hashemi, Pacific Palisades, CA (US)

(73) Assignee: University of Southern California, Los Angeles, CA (US)

( * ) Notice: Subject to any disclaimer, the term of this patent is extended or adjusted under 35 U.S.C. 154(b) by 0 days.

(21) Appl. No.: 14/624,289

(22) Filed: Feb. 17, 2015

(65) Prior Publication Data

US 2015/0236842 A1    Aug. 20, 2015

Related U.S. Application Data

(60) Provisional application No. 61/940,057, filed on Feb. 14, 2014.

(51) Int. Cl.
*H03H 7/46* (2006.01)
*H04B 1/58* (2006.01)
(Continued)

(52) U.S. Cl.
CPC ............ *H04L 5/1461* (2013.01); *H04B 1/525* (2013.01)

(58) Field of Classification Search
CPC ........ H04L 5/1461; H03H 7/463; H04B 1/58; H04B 1/525
See application file for complete search history.

(56) References Cited

U.S. PATENT DOCUMENTS

| 2,561,212 A | 7/1951 | Lewis |
| 3,025,463 A | 3/1962 | Luoma et al. |

(Continued)

FOREIGN PATENT DOCUMENTS

| CN | 2783638 Y | 5/2006 |
| CN | 101606332 A | 12/2009 |

(Continued)

OTHER PUBLICATIONS

USPTO. 2016. Final Office Action, dated Mar. 31, 2016, for U.S. Appl. No. 14/626,572, entitled "Miniature Acoustic Resonator Based Filters and Duplexers with Cancellation Methodology," filed Feb. 19, 2015.

(Continued)

*Primary Examiner* — Walter J Divito
(74) *Attorney, Agent, or Firm* — Withrow & Terranova, P.L.L.C.

(57) ABSTRACT

A multi-port hybrid-based cancellation network may include a first and second hybrid coupler, and a first and second two-port network. The second hybrid coupler may be distinct from the first hybrid coupler. The first two-port network may include a first filter connected between the first and the second hybrid couplers. The second two-port network may include a second filter that is distinct from but essentially the same as the first filter connected between the first and the second hybrid couplers. Other circuitry components may be connected to one of the ports of multi-port hybrid-based cancellation network. These other circuitry components may have a configuration that increases or maximizes signal isolation between at least two of the ports of the multi-port hybrid-based cancellation network.

32 Claims, 8 Drawing Sheets

(51) Int. Cl.
*H04L 5/14* (2006.01)
*H04B 1/525* (2015.01)

(56) References Cited

U.S. PATENT DOCUMENTS

| | | |
|---|---|---|
| 3,453,638 A | 7/1969 | Hoovler |
| 3,704,409 A | 11/1972 | Oomen |
| 3,800,218 A | 3/1974 | Shekel |
| 4,029,902 A | 6/1977 | Bell, Jr. et al. |
| 4,146,851 A | 3/1979 | Dempsey et al. |
| 4,427,936 A | 1/1984 | Riblet et al. |
| 4,464,675 A | 8/1984 | Balaban et al. |
| 4,489,271 A | 12/1984 | Riblet |
| 4,694,266 A | 9/1987 | Wright |
| 4,721,901 A | 1/1988 | Ashley |
| 4,963,945 A | 10/1990 | Cooper et al. |
| 4,964,945 A | 10/1990 | Calhoun |
| 4,968,967 A | 11/1990 | Stove |
| 5,408,690 A | 4/1995 | Ishikawa et al. |
| 5,483,248 A * | 1/1996 | Milroy ............ H01Q 13/28 343/767 |
| 5,493,246 A | 2/1996 | Anderson |
| 5,525,945 A | 6/1996 | Chiappetta et al. |
| 5,574,400 A | 11/1996 | Fukuchi |
| 5,691,978 A | 11/1997 | Kenworthy |
| 5,781,084 A | 7/1998 | Rhodes |
| 6,178,310 B1 | 1/2001 | Jeong |
| 6,194,980 B1 | 2/2001 | Thon |
| 6,229,992 B1 | 5/2001 | McGeehan et al. |
| 6,262,637 B1 | 7/2001 | Bradley et al. |
| 6,297,711 B1 | 10/2001 | Seward et al. |
| 6,496,061 B1 | 12/2002 | Bloom et al. |
| 6,580,729 B1 | 6/2003 | Grandchamp et al. |
| 6,721,544 B1 | 4/2004 | Franca-Neto |
| 6,819,302 B2 | 11/2004 | Volman |
| 6,946,847 B2 | 9/2005 | Nishimori et al. |
| 7,072,614 B1 | 7/2006 | Kasperkovitz |
| 7,116,966 B2 | 10/2006 | Hattori et al. |
| 7,123,883 B2 | 10/2006 | Mages |
| 7,250,830 B2 | 7/2007 | Layne et al. |
| 7,283,793 B1 * | 10/2007 | McKay ............ H04B 1/0458 333/103 |
| 7,330,500 B2 | 2/2008 | Kouki |
| 7,369,811 B2 | 5/2008 | Bellantoni |
| 7,623,005 B2 | 11/2009 | Johansson et al. |
| 7,633,435 B2 | 12/2009 | Meharry et al. |
| 7,636,388 B2 | 12/2009 | Wang et al. |
| 7,711,329 B2 | 5/2010 | Aparin et al. |
| 7,804,383 B2 | 9/2010 | Volatier et al. |
| 7,894,779 B2 | 2/2011 | Meiyappan et al. |
| 8,013,690 B2 | 9/2011 | Miyashiro |
| 8,135,348 B2 | 3/2012 | Aparin |
| 8,149,742 B1 | 4/2012 | Sorsby |
| 8,199,681 B2 | 6/2012 | Zinser et al. |
| 8,385,871 B2 | 2/2013 | Wyville |
| 8,422,412 B2 | 4/2013 | Hahn |
| 8,514,035 B2 | 8/2013 | Mikhemar et al. |
| 8,600,329 B1 | 12/2013 | Comeau et al. |
| 8,620,246 B2 | 12/2013 | McKinzie et al. |
| 8,749,321 B2 | 6/2014 | Kim et al. |
| 8,761,026 B1 | 6/2014 | Berry et al. |
| 8,942,657 B2 | 1/2015 | McKinzie, III et al. |
| 8,957,742 B2 | 2/2015 | Spears et al. |
| 9,048,805 B2 | 6/2015 | Granger-Jones et al. |
| 9,214,718 B2 | 12/2015 | Mow et al. |
| 9,450,553 B2 | 9/2016 | Langer et al. |
| 9,479,214 B2 | 10/2016 | Webb et al. |
| 9,490,866 B2 | 11/2016 | Goel et al. |
| 9,500,727 B2 | 11/2016 | Sohn et al. |
| 9,543,630 B2 | 1/2017 | Tokumitsu |
| 9,590,794 B2 | 3/2017 | Analui et al. |
| 2002/0089396 A1 | 7/2002 | Noguchi et al. |
| 2003/0109077 A1 | 6/2003 | Kim et al. |
| 2004/0000425 A1 | 1/2004 | White et al. |
| 2004/0127178 A1 | 7/2004 | Kuffner |
| 2004/0180633 A1 | 9/2004 | Nakatani et al. |
| 2005/0070232 A1 | 3/2005 | Mages |
| 2005/0245213 A1 | 11/2005 | Hirano et al. |
| 2005/0289632 A1 | 12/2005 | Brooks |
| 2006/0019611 A1 | 1/2006 | Mages |
| 2007/0105509 A1 | 5/2007 | Muhammad et al. |
| 2008/0128901 A1 | 6/2008 | Zurcher et al. |
| 2008/0227409 A1 | 9/2008 | Chang et al. |
| 2008/0240000 A1 | 10/2008 | Kidd |
| 2008/0261519 A1 | 10/2008 | Demarco et al. |
| 2009/0054008 A1 | 2/2009 | Satou |
| 2009/0121797 A1 | 5/2009 | Karabatsos |
| 2009/0125253 A1 | 5/2009 | Blair et al. |
| 2009/0252252 A1 | 10/2009 | Kim et al. |
| 2009/0253385 A1 | 10/2009 | Dent et al. |
| 2009/0289744 A1 | 11/2009 | Miyashiro |
| 2010/0002620 A1 | 1/2010 | Proctor, Jr. et al. |
| 2010/0084146 A1 | 4/2010 | Roberts |
| 2010/0109771 A1 | 5/2010 | Baik et al. |
| 2010/0127795 A1 | 5/2010 | Bauer et al. |
| 2010/0134700 A1 | 6/2010 | Robert et al. |
| 2010/0148886 A1 | 6/2010 | Inoue et al. |
| 2010/0177917 A1 | 7/2010 | Van Der Werf |
| 2010/0323654 A1 | 12/2010 | Judson et al. |
| 2011/0069644 A1 | 3/2011 | Kim et al. |
| 2011/0080229 A1 | 4/2011 | Kennington |
| 2011/0080856 A1 | 4/2011 | Kenington |
| 2011/0134810 A1 | 6/2011 | Yamamoto et al. |
| 2011/0140803 A1 | 6/2011 | Kim et al. |
| 2011/0227664 A1 | 9/2011 | Wyville |
| 2011/0256857 A1 | 10/2011 | Chen et al. |
| 2012/0007605 A1 | 1/2012 | Benedikt |
| 2012/0063496 A1 | 3/2012 | Giannini et al. |
| 2012/0075069 A1 | 3/2012 | Dickey et al. |
| 2012/0094617 A1 | 4/2012 | Tone et al. |
| 2012/0099624 A1 | 4/2012 | Nagaya et al. |
| 2012/0140860 A1 | 6/2012 | Rimini et al. |
| 2012/0154071 A1 | 6/2012 | Bradley et al. |
| 2012/0161784 A1 * | 6/2012 | Benedikt ............ G01R 31/2837 324/612 |
| 2012/0163245 A1 | 6/2012 | Tone et al. |
| 2012/0194269 A1 | 8/2012 | Schlager et al. |
| 2012/0201153 A1 | 8/2012 | Bharadia et al. |
| 2012/0201173 A1 | 8/2012 | Jain et al. |
| 2012/0212304 A1 | 8/2012 | Zhang et al. |
| 2012/0230227 A1 | 9/2012 | Weiss |
| 2013/0010654 A1 | 1/2013 | Kushnir |
| 2013/0016634 A1 | 1/2013 | Smiley |
| 2013/0063299 A1 | 3/2013 | Proudkii |
| 2013/0065542 A1 | 3/2013 | Proudkii |
| 2013/0079641 A1 | 3/2013 | Zwirn |
| 2013/0083703 A1 | 4/2013 | Granger-Jones et al. |
| 2013/0109330 A1 | 5/2013 | Sahota et al. |
| 2013/0113576 A1 | 5/2013 | Inoue et al. |
| 2013/0130619 A1 | 5/2013 | Harverson et al. |
| 2013/0154887 A1 | 6/2013 | Hein et al. |
| 2013/0190036 A1 | 7/2013 | Zhao et al. |
| 2013/0201880 A1 | 8/2013 | Bauder et al. |
| 2013/0201881 A1 | 8/2013 | Bauder et al. |
| 2013/0201882 A1 | 8/2013 | Bauder et al. |
| 2013/0222059 A1 | 8/2013 | Kilambi et al. |
| 2013/0241655 A1 | 9/2013 | Liss et al. |
| 2013/0241656 A1 | 9/2013 | Tajima et al. |
| 2013/0241669 A1 | 9/2013 | Mikhemar et al. |
| 2013/0242809 A1 | 9/2013 | Tone et al. |
| 2013/0245976 A1 | 9/2013 | Hind |
| 2013/0287144 A1 | 10/2013 | Paulin et al. |
| 2013/0301488 A1 | 11/2013 | Hong et al. |
| 2013/0321097 A1 | 12/2013 | Khlat et al. |
| 2014/0103946 A1 | 4/2014 | Vanden Bossche |
| 2014/0140860 A1 | 5/2014 | Tibbott et al. |
| 2014/0154981 A1 | 6/2014 | Nakatani |
| 2014/0169236 A1 | 6/2014 | Choi et al. |
| 2014/0194073 A1 | 7/2014 | Wyville et al. |
| 2014/0204808 A1 | 7/2014 | Choi et al. |
| 2014/0348018 A1 | 11/2014 | Bharadia et al. |
| 2014/0376419 A1 | 12/2014 | Goel et al. |
| 2015/0049841 A1 | 2/2015 | Laporte et al. |
| 2015/0118978 A1 | 4/2015 | Khlat |

(56) References Cited

U.S. PATENT DOCUMENTS

| | | | |
|---|---|---|---|
| 2015/0163044 | A1 | 6/2015 | Analui et al. |
| 2015/0236390 | A1 | 8/2015 | Analui et al. |
| 2015/0236395 | A1 | 8/2015 | Analui et al. |
| 2016/0050031 | A1 | 2/2016 | Hwang et al. |
| 2016/0134325 | A1 | 5/2016 | Tageman et al. |
| 2016/0204821 | A1 | 7/2016 | Han et al. |
| 2016/0211870 | A1 | 7/2016 | Wu et al. |
| 2016/0380706 | A1 | 12/2016 | Tanzi et al. |
| 2017/0030339 | A1* | 2/2017 | Proudfoot .............. F02G 1/043 |
| 2017/0070368 | A1 | 3/2017 | Mandegaran |
| 2018/0083591 | A1 | 3/2018 | Mandegaran |
| 2018/0309464 | A1 | 10/2018 | Mandegaran |

FOREIGN PATENT DOCUMENTS

| | | |
|---|---|---|
| DE | 102012107877 A1 | 2/2014 |
| EP | 1091497 A1 | 4/2001 |
| EP | 2733855 A1 | 5/2014 |
| EP | 2814172 A1 | 12/2014 |
| EP | 2960981 A1 | 12/2015 |
| JP | 2012089995 A | 5/2012 |
| JP | 2012095058 A | 5/2012 |
| KR | 10-2010-0134324 | 12/2011 |
| WO | WO 95/15018 A1 | 6/1995 |
| WO | 0052841 A1 | 9/2000 |
| WO | WO2014032883 A1 | 3/2014 |
| WO | WO2014133625 A2 | 9/2014 |
| WO | WO2015089092 A1 | 6/2015 |
| WO | 2016063108 A1 | 4/2016 |

OTHER PUBLICATIONS

USPTO. 2016. Non-final Office Action, dated May 20, 2016, for U.S. Appl. No. 14/622,627, entitled "Reflection and Hybrid Reflection Filters."
USPTO. 2016. Non-final Office Action, dated Jul. 15, 2016, for U.S. Appl. No. 14/626,572, entitled "Miniature Acoustic Resonator-Based Filters and Duplexers with Cancellation Methodology."
USPTO. 2016. Notice of Allowance, dated Jul. 20, 2016, for U.S. Appl. No. 14/102,244, entitled "Passive Leakage Cancellation Networks for Duplexers and Coexisting Wireless Communication Systems."
Hunter, I.C. et al. 2005. Passive Microwave Receive Filter Networks Using Low-Q Resonators. IEEE Microwave Magazine, Sep. 2005, pp. 46-53.
Kannangara, S. et al. 2007. Analysis of an Adaptive Wideband Duplexer With Double-Loop Cancellation. IEEE Transactions on Vehicular Technology, vol. 56, No. 4, pp. 1761-1982, Jul. 2007.
Laforge, P.D. et al 2009. Diplexer design implementing highly miniaturized multilayer superconducting hybrids and filters. IEEE Transactions on Applied Superconductivity, Apr. 2009, pp. 47-54.
Marcatili, E.A. et al. 1961. Band-Splitting Filter. Bell System Technical Journal, Jan. 1961, pp. 197-212.
Matthaei, G. et al. 1980. Microwave Filters, Impedance-Matching Networks, and Coupling Structures, Chapter 14: Directional, Channel-Separation Filters and Traveling-Wave Ring-Resonators, pp. 843-888; Chapter 16: Multiplexer Design, pp. 965-1000. Copyright 1980 Artech House, Inc., Dedham, MA; reprint of edition published by McGraw-Hill Book Company, Inc., 1964.
Phudpong, P. et al. 2007. Nonlinear Matched Reflection Mode Bandstop Filters for Frequency Selective Limiting Applications. In Microwave Symposium Conference, 2007, IEEE/MTT-S International, 2007, pp. 1043-1046.
Korean International Searching Authority (ISA/KR). 2014. International Search Report and Written Opinion of the International Searching Authority, dated Sep. 23, 2014, for PCT Application PCT/US2013/074155, entitled "Passive Leakage Cancellation Networks for Duplexers and Coexisting Wireless Communication Systems," published as WO 2014/133625A1.
United States International Searching Authority (ISA/US). 2015. International Search Report and Written Opinion of the International Searching Authority, dated Mar. 3, 2015, for PCT Application PCT/US069372, entitled "Enhancing Isolation and Impedance Matching in Hybrid-Based Cancellation Networks and Duplexers," filed Dec. 9, 2014.
United States International Searching Authority (ISA/US). 2015. International Search Report and Written Opinion of the International Searching Authority, dated May 20, 2015, for PCT Application PCT/US2015/016145, entitled "Hybrid-Based Cancellation in Presence of Antenna Mismatch," filed Feb. 17, 2015.
United States International Searching Authority (ISA/US). 2015. International Search Report and Written Opinion of the International Searching Authority, dated May 27, 2015, for PCT Application PCT/US2015/015930, entitled "Reflection and Hybrid Reflection Filters," filed Feb. 13, 2015.
United States Patent and Trademark Office. 2015. Non-final Office Action, dated Jun. 15, 2015, for U.S. Appl. No. 14/102,244, filed Dec. 10, 2013, entitled "Passive Leakage Cancellation Networks for Duplexers and Coexisting Wireless Communication Systems," published Dec. 25, 2015 as US2014/0376419.
European Patent Office (EPO). 2016. Extended European Search Report, dated Jul. 4, 2016, for European Application No. 13876497.2, entitled "Passive Leakage Cancellation Networks for Duplexers and Coexisting Wireless Communication Systems."
USPTO. 2015. Final Office Action for U.S. Appl. No. 14/102,244, dated Sep. 22, 2015, entitled "Passive Leakage Cancellation Networks for Duplexers and Coexisting Wireless Communication Systems," Goel et al., inventors, published Dec. 25, 2014 as US 2014/0376419 A1.
USPTO. 2015. Office Action, dated Jul. 29, 2015 for U.S. Appl. No. 14/626,572, entitled "Miniature Acoustic Resonator Based Filters and Duplexers with Cancellation Methodology," filed Feb. 19, 2015.
United States International Searching Authority (ISA/US). 2015. International Search Report and Written Opinion of the International Searching Authority, dated Jun. 25, 2015, for PCT Application PCT/US2015/016642, entitled "Miniature Acoustic Resonator-Based Filters and Duplexers with Cancellation Methodology," filed Feb. 19, 2015.
Notice of Allowance dated Feb. 16, 2017 for U.S. Appl. No. 14/622,627, filed Feb. 13, 2015, 8 pgs.
Final Office Action dated Feb. 16, 2017 for U.S. Appl. No. 14/626,572, filed Feb. 19, 2015, 13 pgs.
Notice of Allowance dated Nov. 4, 2016 for U.S. Appl. No. 14/565,752, filed Dec. 10, 2014, 66 pgs.
Notice of Allowance dated Aug. 14, 2017 for U.S. Appl. No. 14/622,627 filed Feb. 13, 2015, 7 pgs.
Notice of Allowance dated Oct. 18, 2017, U.S. Appl. No. 14/626,572, filed Feb. 19, 2015, 15 pgs.
Notice of Allowance for U.S. Appl. No. 15/528,876, dated Jul. 3, 2019, 8 pages.
Advisory Action for U.S. Appl. No. 15/711,692, dated May 31, 2019, 3 pages.
International Preliminary Report on Patentability for International Patent Application No. PCT/US2013/074155, dated Jun. 25, 2015, 7 pages.
International Preliminary Report on Patentability for International Patent Application No. PCT/US2014/069372, dated Jun. 23, 2016, 8 pages.
International Preliminary Report on Patentability for International Patent Application No. PCT/US2015/015930, dated Aug. 25, 2016, 8 pages.
International Preliminary Report on Patentability for International Patent Application No. PCT/US2015/016145, dated Aug. 25, 2016, 6 pages.
International Preliminary Report on Patentability for International Patent Application No. PCT/US2015/016642, dated Sep. 1, 2016, 9 pages.
International Search Report and Written Opinion for International Patent Application No. PCT/US2016/54646, dated Dec. 29, 2016.

(56) References Cited

OTHER PUBLICATIONS

International Preliminary Report on Patentability for International Patent Application No. PCT/US2016/54646, dated Oct. 5, 2017, 5 pages.
International Search Report and Written Opinion for International Patent Application No. PCT/US2017/052699, dated Dec. 4, 2017, 14 pages.
International Preliminary Report on Patentability for International Patent Application No. PCT/US2017/052699, dated Apr. 4, 2019, 8 pages.
Notification of Reasons for Refusal for Japanese Patent Application No. 2015-547473, dated Mar. 2, 2017, 6 pages.
The First Office Action for Chinese Patent Application No. 201480067651.0, dated Jun. 22, 2018, 27 pages.
The First Office Action for Chinese Patent Application No. 201580009478.3, dated Dec. 27, 2018, 34 pages.
Notice of Allowance for U.S. Appl. No. 15/528,876, dated Nov. 7, 2018, 8 pages.
Notice of Allowance for U.S. Appl. No. 15/528,876, dated Mar. 6, 2019, 9 pages.
Non-Final Office Action for U.S. Appl. No. 15/711,692, dated Dec. 13, 2018, 17 pages.
Final Office Action for U.S. Appl. No. 15/711,692, dated Apr. 11, 2019, 21 pages.
Notification of the First Office Action for Chinese Patent Application No. 201680059896.8, dated Apr. 2, 2019, 11 pages.
Notice of Allowance for U.S. Appl. No. 16/512,550, dated Aug. 27, 2019, 9 pages.
Notification of the Second Office Action for Chinese Patent Application No. 201580009478.3, dated Jul. 17, 2019, 11 pages.
Non-Final Office Action for U.S. Appl. No. 15/711,692, dated Nov. 4, 2019, 23 pages.
Notice of Allowance for U.S. Appl. No. 16/662,864, dated Dec. 9, 2019, 7 pages.
Notification of the First Office Action for Chinese Patent Application No. 2017900013920, dated Sep. 27, 2019, 5 pages.
Notice of Allowance for U.S. Appl. No. 16/663,542, dated Jan. 31, 2020, 8 pages.
Final Office Action for U.S. Appl. No. 15/711,692, dated Dec. 26, 2019, 22 pages.
Office Action for Chinese Patent Application No. 2016800598968, dated Dec. 23, 2019, 6 pages.

* cited by examiner

HYBRID-BASED CANCELLATION IN PRESENCE OF ANTENNA MISMATCH

CROSS-REFERENCE TO RELATED APPLICATIONS

This application is based upon and claims priority to U.S. provisional patent application 61/940,057, entitled "Methodology for Passive Cancellation-Based Antenna Mismatch Correction for Duplexers," filed Feb. 14, 2014. The entire content of this application is incorporated herein by reference.

STATEMENT REGARDING FEDERALLY SPONSORED RESEARCH

This invention was made with Government support under Contract No. N00014-12-C-0130, awarded by the Office of Naval Research (ONR) and under Contract No. HR0011-12-C-0094, awarded by the Defense Advanced Research Projects Agency (DARPA). The Government has certain rights in the invention.

BACKGROUND

Technical Field

This disclosure relates to communication systems supporting simultaneous transmit and receive, co-existent communication devices, systems requiring enhanced isolation between certain ports or blocks, and other systems where signal cancellations are achieved through hybrid couplers.

Description of Related Art

In a frequency division duplex (FDD) radio communication system, the transmitter (TX) and the receiver (RX) of the same radio may operate simultaneously, but, in two different frequency bands, $f_{TX}$ for TX and $f_{RX}$ for RX. In such scenarios, an important performance metric for the radio communication system may be the degree of "isolation" between the TX and the RX that are operating simultaneously. The isolation can be particularly important within the TX frequency band and within the RX frequency band. Any TX leakage that reaches the RX may interfere significantly with the receiver.

It should be noted that, for simplicity and consistent with common notations, a singular frequency (such as $f_{TX}$ & $f_{RX}$) is used herein to designate a frequency band that includes many (infinite) frequencies. These singular frequencies often refer to a frequency within the frequency band such as the center of the band or edge of the band. This notation should not be construed to limit the teachings of this disclosure in any way.

On the other hand, many platforms include several communication devices at close proximity. Examples may include commercial or military platforms, such as handheld or portable platforms, that include various voice and data communication transceivers as well as wireless positioning solutions. For instance, modern smartphones include cellular phone transceivers, Bluetooth transceivers, WiFi transceivers, Global Positioning System (GPS) receivers, and in some instances radio or television receivers. In these platforms, various communication devices may operate at the same time, resulting in unwanted interference among them. In such co-existence scenarios, high isolation between various simultaneously-operating communication devices may be needed to ensure proper operation.

The minimum required isolation may depend on the application and the scenario. For example, in a typical commercial FDD radio standard, TX to RX isolation of 50 dB or more may be required in the TX and the RX frequency bands. Without adequate isolation, the aggressor TX signal may significantly deteriorate the sensitivity of the victim RX and ultimately prevent its proper operation. In a co-existence radio, the isolation between the platforms may need to be even higher. For instance, the frequencies allocated to WiFi standards may be very close to the frequencies allocated to cellular phones. The high power level of a transmitter in a WiFi transceiver may degrade the receiving performance of a cellular receiver and vice versa.

One approach to providing TX-RX isolation is to use a frequency duplexer. The frequency duplexer is a three port electrical network. One port is typically connected to the antenna (ANT), one port is typically connected to the TX output, and one port is typically connected to the RX input. There may be other components, such as impedance matching networks or filters or coupling/decoupling components, between the duplexer ports and ANT, RX, and TX ports.

A common challenge in duplexer design is to achieve low insertion loss from TX to ANT and from ANT to RX, while providing high isolation from TX to RX. However, meeting this requirement may require technologies that offer high quality factor (Q), or low loss, components and resonators. These technologies, such as those based on bulk acoustic wave (BAW), are often more expensive or bulky compared with technologies that do not offer high-Q components and resonators.

Another approach to enhancing isolation between TX and RX is to generate a cancellation signal that fully or partially matches the amplitude of the leakage signal from the aggressor TX to the victim RX, but with a negative sign. The cancellation signal is then combined with the leakage signal (subtraction) resulting in an enhanced isolation between TX and RX.

Examples of cancellation networks utilizing quadrature hybrids and other components to ensure an acceptable amount of isolation among various ports are disclosed in U.S. Pat. Nos. 2,561,212, 7,123,883, and 7,623,005, and U.S. pre-grant publications 2013/0201880, 2013/0201881, and 2013/0321097.

A variety of non-idealities, such as component mismatches, path imbalances, finite component isolations, impedance mismatches, and varying antenna mismatch, however, can diminish the effectiveness of the cancellation and thus the degree of isolation that is achieved, as well as the amount of signal return losses at an impedance mismatched port.

A common approach to improve the performance of a hybrid based duplexer in the presence of antenna impedance mismatch is to include an antenna tuner prior to the antenna. U.S. pre-grant publication 2013/0201880 discloses such an approach in the context of a tunable duplexer. U.S. pre-grant publication 2013/0321097 discloses an alternative approach where tunable loads and 90 degree phase shifters are introduced to a hybrid based duplexer scheme to improve the isolation in the presence of antenna impedance mismatch.

Approaches towards mitigation of the antenna impedance mismatch in hybrid based duplexers can require components, such as phase shifters, that may not be realizable in compact, low loss, and cost efficient ways, especially when the duplexer should cover a wide range of frequencies. Many communication systems, including those for cellular phone and wireless connectivity standards, may need to support large contiguous or noncontiguous frequency bands to increase the data-rate, diversity, or robustness.

SUMMARY

A multi-port hybrid-based cancellation network may include a first and second hybrid coupler, and a first and second two-port network. The second hybrid coupler may be distinct from the first hybrid coupler. The first two-port network may include a first filter connected between the first and the second hybrid couplers. The second two-port network may include a second filter that is distinct from but essentially the same as the first filter connected between the first and the second hybrid couplers. Other circuitry components may be connected to one of the ports of multi-port hybrid-based cancellation network. These other circuitry components may have a configuration that increases or maximizes signal isolation between at least two of the ports of the multi-port hybrid-based cancellation network.

The first and the second two-port networks may each include a filter which may each be tunable or switchable, multiple filters connected in parallel or series.

The one or more other circuitry components may include one or more attenuators, phase shifters, delay elements, and/or impedance matching networks, each with fixed or tunable characteristics.

At least one of the hybrid couplers, the two-port networks, or the other circuitry components may include an adjustable component that can be adjusted to minimize the signal return loss or maximize the signal isolation. The multi-port hybrid-based cancellation network may include additional circuitry that detects signals at one or more of the ports and develops information or one or more signals based on the detected signal(s) that is relevant to adjusting the adjustable component to minimize the signal return loss or maximize the signal isolation.

The multi-port hybrid-based cancellation network may have a configuration that operates effectively within multiple frequency bands.

One of the multi-ports may function as a transmit port, another of the multi-ports may function as a receive port, and another of the multi-ports may function as an antenna port. The first two-port network may include a first filter connected between the first and the second hybrid couplers. The second two-port network may include a second filter that is distinct from but essentially the same as the first filter connected between the first and the second hybrid couplers. The one or more other circuitry components may minimize signal return loss in at least one of the ports of the hybrid-based duplexer and/or maximize signal isolation between the transmit port and the receive port of the multi-port hybrid-based cancellation network. The multi-port hybrid-based cancellation network may further include a third filter that is distinct from the first and the second filters connected to the first hybrid couplers. The third filter may be tunable or switchable.

The ports of the multi-path network may not correspond to the same communication system. For instance, one or more ports may correspond to transmitting ports of one or more communication system, while one or more other ports may correspond to receiving ports of one or more other communication systems in a coexistence scenario.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Figure 1:
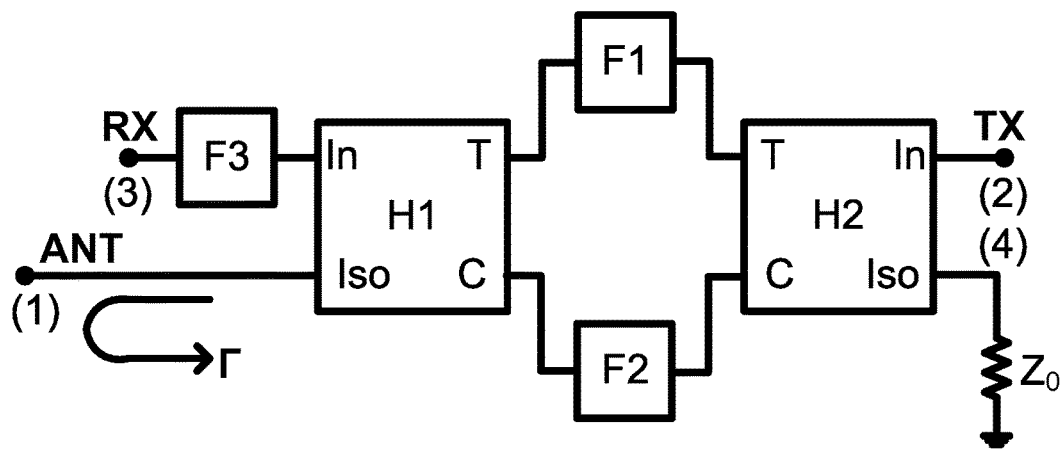
FIG. 1 illustrates an embodiment of a prior art hybrid-based cancellation network without antenna mismatch correction.

Illustrative embodiments are now described. Other embodiments may be used in addition or instead. Details that may be apparent to a person of ordinary skill in the art may have been omitted. Some embodiments may be practiced with additional components or steps and/or without all of the components or steps that are described.

Throughout this disclosure, the term signal is used to designate a quantity that has values over time. The specific structure of the signal is not material, unless explicitly stated. A signal need not be generated from a single source. For instance, a collection of signals received from multiple transmitting sources by a single antenna is still referred to as a signal.

Throughout this disclosure, the term filter corresponds to a two-port network with a corresponding transfer function in frequency domain. The transfer function of the two-port network need not resemble the classical transfer function of known filters such as band pass filters (BPF), low pass filters (LPF), high pass filters (HPF), and band stop filters (BSP) also known as band reject filters (BRF). For instance, the transfer function of a two-port network may have multiple passbands or multiple stopbands or a combination of pass bands and stop bands. The usage of passband or stopband should not be interpreted as a single contiguous frequency band. Passband refers to the range of all frequencies where the signal passes through the two-port network with little or no attenuation. Stopband refers to the range of all frequencies where the signal does not pass through the two-port network or it passes through the two-port network with significant attenuation. Passband or stopband may include multiple disjoint frequency bands. In particular, the teachings of this disclosure are applicable towards realization of cancellation schemes that cover multiple distinct passbands for applications including carrier aggregation, multi-band operation, multi-mode operation, or multi-standard operation.

The transfer function of a two-port network need not be predetermined or fixed. For instance, the transfer function of a two-port network may be tunable. As one representative example, the transfer function of a two-port network may resemble that of a band-pass filter where center frequency and bandwidth can be tuned. The tunability may be in response to external or internal stimuli. Tunable transfer functions may be realized by incorporating one or more tunable components within a two-port network. For instance, tunable capacitors, tunable inductors, tunable resonators, or their combinations may be used to realize a tunable two-port network.

The circuit configuration of a two-port network need not be predetermined or fixed. For instance, the circuit configuration of a two-port network may be reconfigurable. As one representative example, two-port network circuitry may resemble that of a band-pass filter where the filter order can be reconfigured. As another representative example, two-port network circuitry may be reconfigured to change from a band-pass to a band-stop, or vice versa. The reconfigurability may be in response to external or internal stimuli. Reconfigurable circuits may be realized by incorporating one or more switches or other selection circuitry. For instance, mechanical switches or relays, electrical switches using diodes or transistors, Micro Electro Mechanical (MEM) switches, or their combination may be used within the reconfigurable two-port network. A reconfigurable two-port network may also have a tunable transfer function. A two-port network with a tunable transfer function may also incorporate reconfigurable circuitry. Reconfigurable does not include changing components by unsoldering.

The specific implementation of a two-port network may be immaterial. For instance, the filter may be realized using passive components, active components, or a combination of active and passive components. A two-port network may use electrical, electro-mechanical, piezo-electric, or other types of components in its realization. For instance, a two-port network realization may include inductors, capacitors, resonators, transmission lines, or a combination. For instance, a two-port network realization may include surface acoustic wave (SAW) or bulk acoustic wave (BAW) components.

FIG. 1 illustrates an embodiment of a prior art hybrid-based cancellation network. See U.S. pre-grant publications 2013/0201880 and 2013/0201881. A properly-designed hybrid-based cancellation network can provide isolation between certain combinations of ports, while allowing signal propagation between other combinations of ports. In FIG. 1, the intention is to isolate ports (2) and (3) while allowing signal propagation between ports (1) and (3), and also between ports (2) and (1). In the specific example of FIG. 1, Port 3 is designated to be an RX port, port 2 is designated to be a TX port, Port 1 is designated to be an antenna port, and port 4 is terminated with a matched load $Z_0$. The TX port and RX ports need not correspond to the same communication system. The signals expected at the RX and TX ports need not occupy the same range of frequencies. Two essentially identical two-port networks, F1 and F2, may be placed between the two hybrid couplers H1 and H2, and another two-port network F3 may be added at port 3. As an example, F3 may be a filter that passes the signals at the RX frequency band(s). As an example, F1 and F3 may be filters that pass the signals at the TX frequency band(s).

Each hybrid coupler may have four essential ports: an input port (In), a through port (T), a coupled port (C), and an isolated port (Iso). The signal entering the input port may split equally between the through port and the coupled port and no signal may come out of the isolated port. The signals coming out of the through port and the coupled port may have quadrature phase shift with respect to each other corresponding to a Quadrature Hybrid (QH). Any of the four ports of the hybrid coupler may be used as an input port with other ports appropriately reassigned.

As an illustrative conceptual example, both hybrid couplers may be ideal lossless quadrature hybrids. In this embodiment, the signal from port 3 after passing through F3 may get split in two halves because of the first hybrid H1, but with 90° relative phase shift between the "T" and "C" ports. Each half may go through another two-port network (F1 and F2), and the two halves may combine again because of second hybrid H2 at port 2, but with an additional relative phase shift of 90°. Since the total phase shift in one half compared to the other half is 180°, the two halves may get cancelled after recombination.

On the other hand, the two halves of the signal from port 3 after passing through F3 may see the same phase shift when they reach port 4 and hence combine constructively. Similarly, the two halves of the signal from port 1 may see the same phase shift when they reach port 2 and hence also combine constructively. A portion of the two halves of the signal from port 3 after passing through F3 and after the first quadrature hybrid H1, which are already 90° out-of-phase, may get reflected at the inputs of the two networks F1 and F2, go through the first quadrature hybrid H1 again experiencing another 90° phase shift relative to each other, and finally combine constructively at port 1.

In a typical two-port passive filter, signals within the passband may pass through between the two ports with little or no attenuation, while signals outside of the passband may not pass through between the two ports and are reflected at the entrance port. Two-port passive filters can be designed so that signals that are outside of the passband do not pass through between the ports, but, they are not reflected at the entrance ports either. For instance, a BSF or BRF can be designed so that signals within the stop-band do not pass through between the ports and are not reflected at the ports either (absorptive BSF or BRF). Two-port active filters can be designed so that the transfer function between the two ports and the reflection coefficient of the two ports are set independently or near independently. For instance, two-port active filter may be designed so that the signals that do not pass through between the two ports within the passband are not reflected at either port.

In one embodiment, band-pass filters may be used as filtering elements in the hybrid cancellation scheme of FIG. 1. In this case, the signal from port 3 after filtering through F3 with frequency lying in the passband of the filters F1 and F2 may transmit to port 4, while the signal from port 3 after filtering through F3 with frequency lying outside the passband of the filters F1 and F2 may transmit to port 1. Ideally, nothing is transmitted to port 2. Similarly, the signal from port 1 with frequency lying in the passband of the filters F1 and F2 may transmit to port 2, while the signal from port 1 with frequency lying outside the passband of the filters F1 and F2 may transmit to port 3. Ideally, nothing is transmitted to port 4. The roles of the TX and RX ports may be reversed, while simultaneously modifying the frequency response of the filters, in an alternate scheme following a similar fundamental cancellation principle.

Isolation between the TX and RX ports while allowing signal propagation between RX and ANT as well as TX and ANT ports may be desirable in many applications. For instance, in a wireless communication system, it may be desirable to isolate the receiver from the signal and noise of the transmitter while sharing an antenna between the transmitter and receiver. The receiver and transmitter need not correspond to the same communication system. For instance, the transmitter and receiver may correspond to different communication systems (including transmit only and receive only systems) within the same platform or at proximity of each other.

The cancellation property of the two ideal quadrature hybrids H1 and H2 may allow for ideally infinite isolation between the TX port 2 and the RX port 3. However, in presence of antenna mismatch, the isolation can be far from perfect. Antenna impedance may correspond to the effective electrical impedance presented by the antenna to the circuitry. The antenna impedance may be a real or a complex number. Oftentimes, the antenna impedance may be matched to the impedance of the transmission lines or the circuitry that connect to the antenna. Antenna mismatch may correspond to the case where the antenna impedance is different than the impedance of the connecting transmission line or the circuitry.

Let $\Gamma_{ANT}$ be the reflection coefficient of the antenna. The TX to RX isolation approximately may be approximately given as:

$$S_{TX,RX} \approx -\Gamma_{ANT} S_{TX,21} S_{RX,21} S_{TX,11}, \quad (1)$$

where $S_{21,F1}$ and $S_{21,F3}$ are the transfer functions between the inputs and the outputs of the two-port networks F1 and F3, respectively, and $S_{11,F1}$ is the input reflection coefficient of the two-port network F1. The isolation between TX and RX ports may depend on the antenna reflection coefficient.

In one embodiment, the transfer function of the two-port network F3 ($S_{RX,21}$) may have a passband corresponding to receive frequencies. The transfer function of the two-port network F1 ($S_{RX,21}$) may have a passband corresponding to transmit frequencies. As a special case, F3 and F1 may be designed to have essentially non-overlapping passbands. As a numerical example, assume $\Gamma_{ant} = -10$ dB corresponding to voltage standing wave ratio (VSWR)≈2:1, which maybe common in practical implementations, and 20 dB attenuation of RX filter F3 in the TX band and 20 dB attenuation of TX filter F1 in the RX band. The maximum achievable isolation in presence of mismatches may only be about 30 dB.

Other embodiments of the duplexer based on a hybrid cancellation scheme, such as the one where the TX ports and filters are interchanged with the RX port and filter in FIG. 1, may similarly fail to achieve high isolation in the presence of antenna mismatch.

Figure 2:
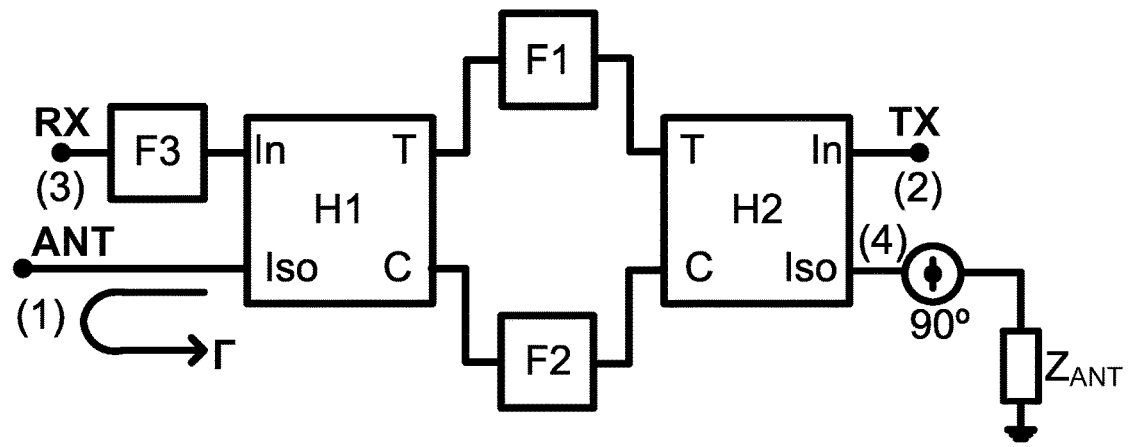
FIG. 2 illustrates an embodiment of a prior art duplexer based on a hybrid cancellation scheme with antenna mismatch correction that requires 90° phase shifter.

FIG. 2 illustrates an embodiment of a prior-art hybrid-based cancellation system with antenna mismatch cancellation to improve the TX to RX isolation. See U.S. Pre-grant publication 2013/0321097. The reflections from an antenna going to TX port 2 may be cancelled by creating cancelling reflections at port 4. $Z_{ANT}$ at port 4 may track the antenna impedance. A 90° phase shifter with this impedance may ensure that a signal undergoing the same reflection as the antenna is created but with 180° phase shift to provide cancellation. One issue with this scheme may be difficulty in realizing a compact, low-loss, or low-cost 90° phase shifter that operates within a wide range of frequencies. Many communication systems, including those for cellular phone and wireless connectivity standards, may need to support large contiguous or noncontiguous frequency bands to increase the data-rate, diversity, or robustness.

Figure 3:
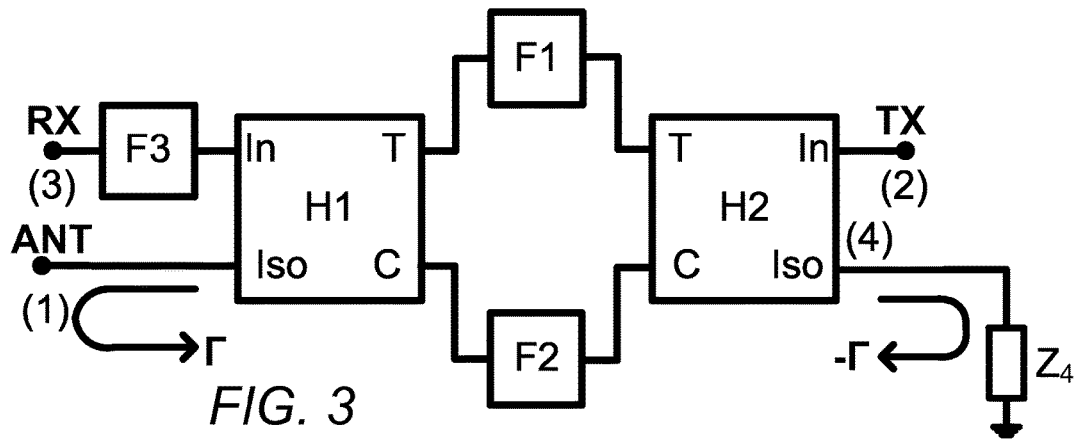
FIG. 3 illustrates an embodiment of an enhanced hybrid-based cancellation scheme with a variable impedance $Z_4$ added to a fourth port to improve the duplexer performance in the presence of various imperfections.

FIG. 3 illustrates an embodiment of an alternate hybrid-based cancellation scheme resilient to antenna mismatch. An impedance $Z_4$ may be added at port 4 whose reflection coefficient has essentially (1) the same magnitude and (2) a phase that is 180° different that those of the antenna impedance $Z_{ant}$ across all the frequencies of interest. The reflected signals from $Z_4$ may thus cancel the reflections from the antenna when they combine at TX port. This antenna mismatch induced isolation enhancement scheme can work in the absence of filter F1 as well.

Impedance $Z_4$ can be realized in various ways. For instance, lumped circuit components or transmission lines may be used to realize $Z_4$.

Figure 4:
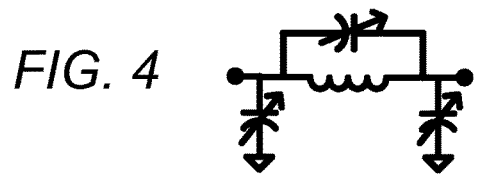
FIG. 4 illustrates an embodiment of circuitry that includes an inductor and tunable capacitors that create variable impedance.

Antenna impedance may be a function of the electromagnetic interface between the antenna and the environment. As such, the objects around the antenna may affect the antenna impedance. In a dynamic environment, the antenna impedance may vary as the electromagnetic environment around the antenna changes. For instance, the antenna impedance of a mobile communication device can change significantly during movements. It may be desirable or necessary that the impedance $Z_4$ be tunable so that it can track the changes of antenna impedance $Z_{ANT}$. Variable components such as variable inductors, variable capacitors, variable transmission lines, or their combinations may be used in the realization of $Z_4$. FIG. 4 shows an example of one embodiment of a variable impedance $Z_4$ using lumped component realization. In this embodiment, fixed inductors and variable capacitors are used.

Proper settings for the tunable impedance $Z_4$ may be generated using circuitry that monitors the isolation between the TX and RX ports and provides the appropriate control signals. Various algorithms may be used for the sense and control feedback schemes. Foreground or background calibration schemes may be used for the sense and feedback scheme. Isolation may be measured using specific signals or signals that are naturally present including noise.

Figure 5:
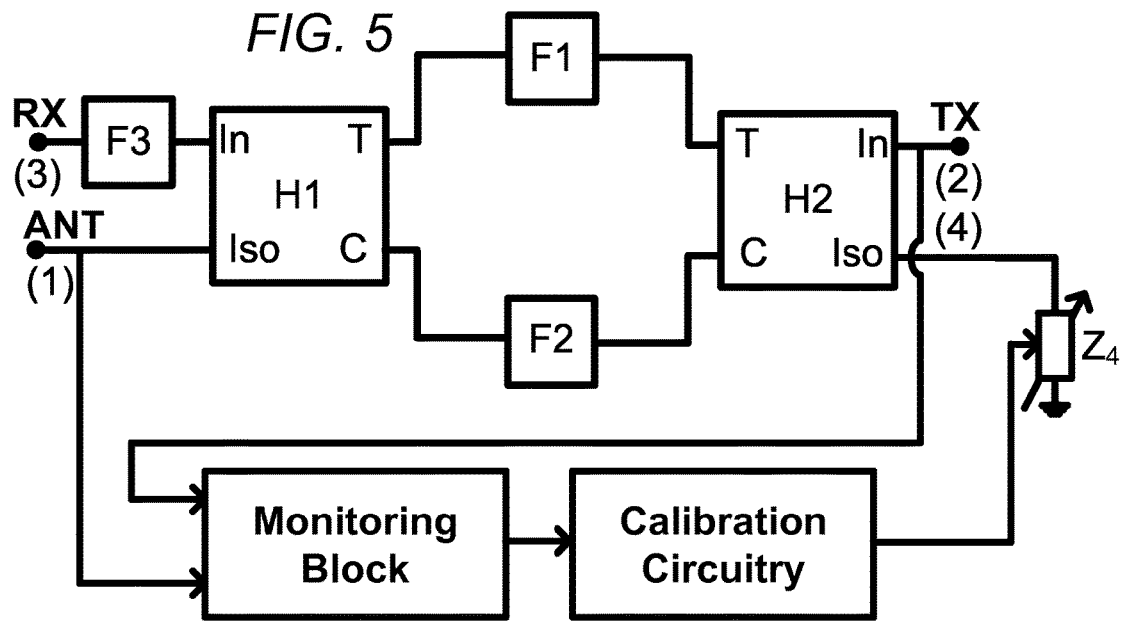
FIG. 5 illustrates an embodiment of an enhanced hybrid-based cancellation scheme with correction circuitry that includes a monitoring block and a calibration circuitry that may be used to adjust $Z_4$ to achieve a desired performance.

FIG. 5 shows an embodiment where the isolation is measured using a sensing scheme, and an appropriate control signal is applied to set the desired value for $Z_4$. It should be noted that the proposed antenna mismatch induced isolation enhancement scheme, as well as the monitoring and calibration circuitries, can work in the absence of filter F1 as well. The monitoring block may be designed in such a way that it does not disturb the normal operation or specifications of the circuitry. For instance, it may not reduce the desired signal power levels at the TX and ANT ports.

The desirable setting for tunable impedance $Z_4$ may be generated manually or through a lookup table.

The performance of a hybrid based cancellation scheme may depend on the matching between various components or ports. For instance, mismatches in the characteristics of the two-port networks F1 and F2 or mismatches in the amplitudes and phases of the hybrid ports may degrade the performance. Such mismatches may degrade the cancellation amount or the TX to RX isolation.

Figure 6:
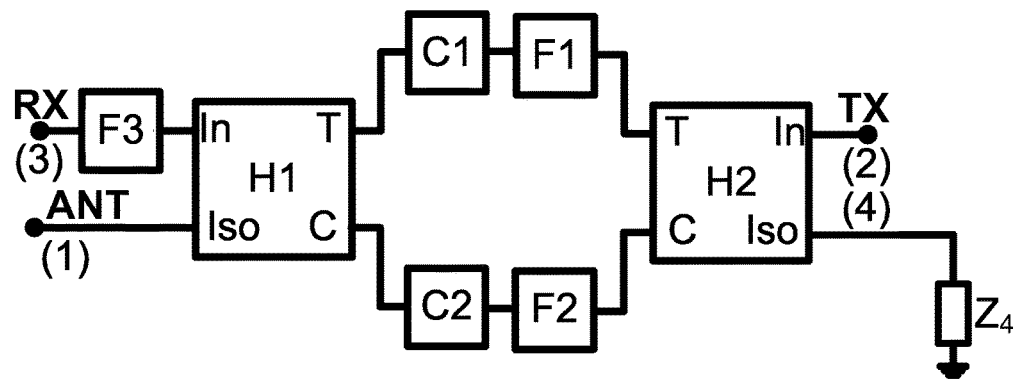
FIG. 6 illustrates an embodiment of an enhanced hybrid-based cancellation scheme that includes two variable two-port networks, C1 and C2, added between the two hybrid couplers to improve the duplexer performance in the presence of various imperfections.

FIG. 6 illustrates an embodiment of an enhanced hybrid based cancellation scheme where two-port networks C1 and C2 are added in between the hybrids. These two-port networks may improve the TX to RX isolation in the presence of component mismatches.

Mismatches between components may not be known in advance and prior to fabrication. Therefore, a proper two-port network transfer function for C1 and C2 may not be known in advance and prior to fabrication.

Figure 7:
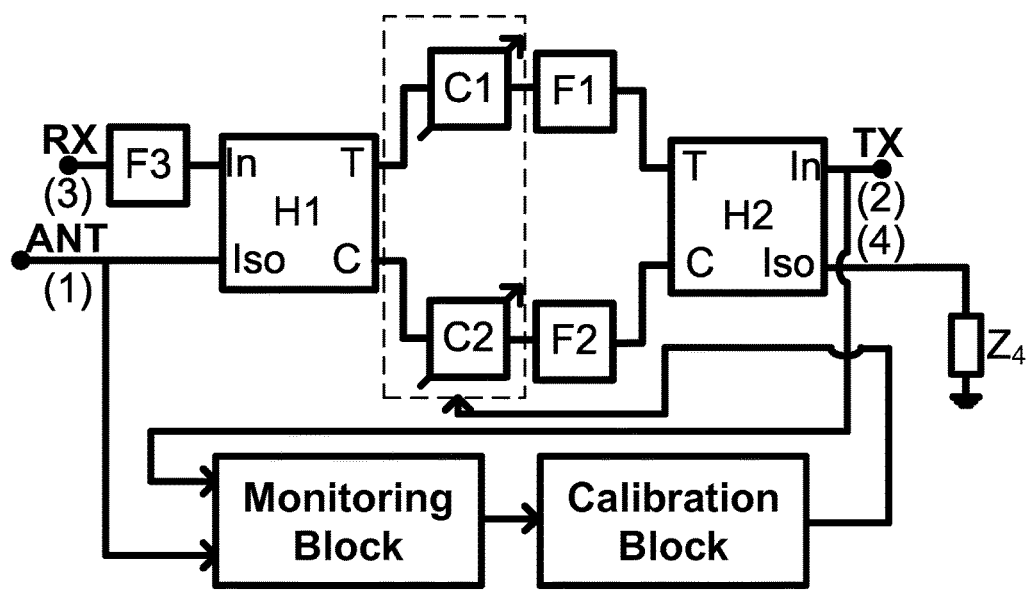
FIG. 7 illustrates an embodiment of an enhanced hybrid-based cancellation scheme with correction circuitry that includes a monitoring block and calibration circuitry that may be used to adjust C1 and C2 to achieve a desired performance.

FIG. 7 illustrates an embodiment an enhanced hybrid based cancellation scheme where two-port networks C1 and C2, added in between the hybrids, are variable. The variable two-port networks C1 and C2 may include tunable phase shifters, tunable attenuators, tunable delay elements, or any combination of them. The proper settings for the variable two-port networks C1 and C2 may be provided post-fabrication in a manual or automatic way. For example, the performance of the cancellation scheme, such as the isolation, can be measured using a monitoring block that then provides an input into a calibration block that ultimately sets the proper values for C1 and C2.

Figure 8:
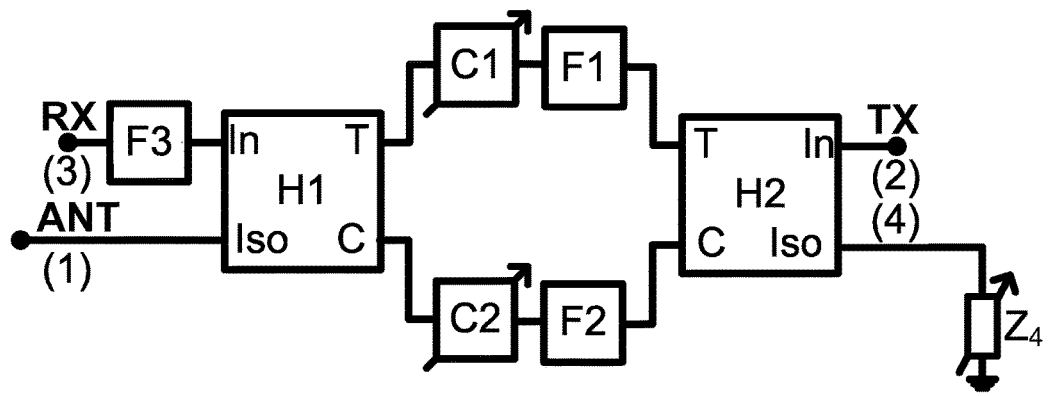
FIG. 8 illustrates an embodiment of an enhanced hybrid-based cancellation scheme that includes two variable two-port networks, C1 and C2, added between two hybrid couplers, and a variable impedance $Z_4$ added to a forth port to collectively improve the duplexer performance in the presence of various imperfections.

FIG. 8 illustrates an embodiment of an enhanced hybrid based cancellation scheme where variable two-port networks C1 and C2 are added in between the hybrids, and variable impedance $Z_4$, at port 4, may be present. C1, C2, and $Z_4$ may collectively improve the performance of the hybrid based cancellation scheme. For instance, they may improve the performance of the hybrid based cancellation scheme in presence of antenna impedance mismatch and component mismatches. The proper settings for C1, C2, and $Z_4$ may be provided post-fabrication in a manual or automatic way.

Figure 9:
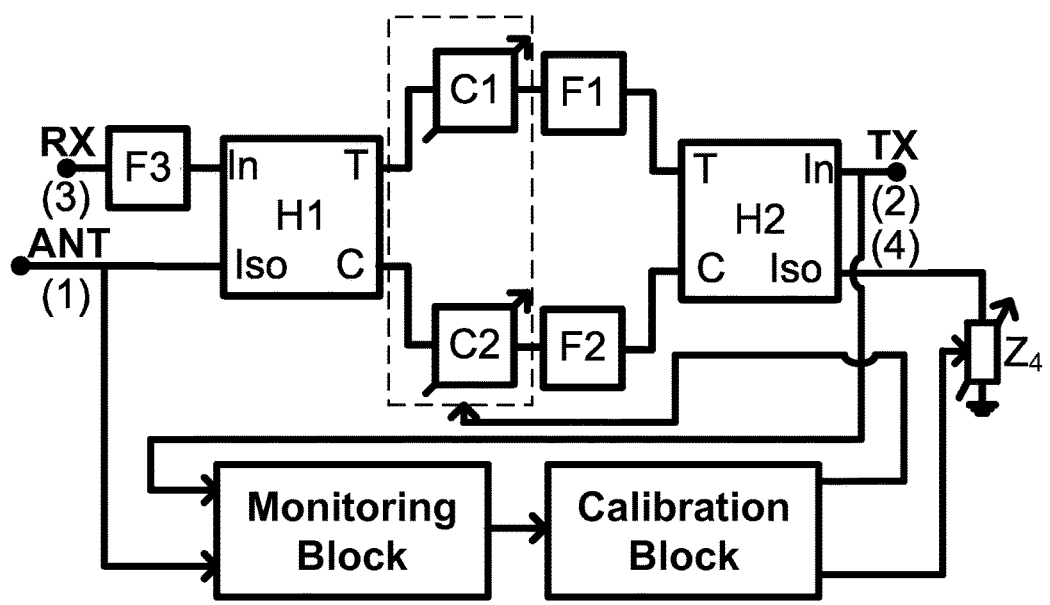
FIG. 9 illustrates an embodiment of an enhanced hybrid-based cancellation scheme with correction circuitry that includes a monitoring block and calibration circuitry that may be used to adjust C1, C2, and $Z_4$ to achieve a desired performance.

FIG. 9 illustrates an embodiment an enhanced hybrid based cancellation scheme where the proper settings for C1, C2, and $Z_4$ may be provided in an automatic way. For example, the performance of the cancellation scheme, such as the isolation, can be measured using a monitoring block that then provides an input into a calibration block that ultimately sets the proper values for C1, C2, and $Z_4$.

Figure 10:
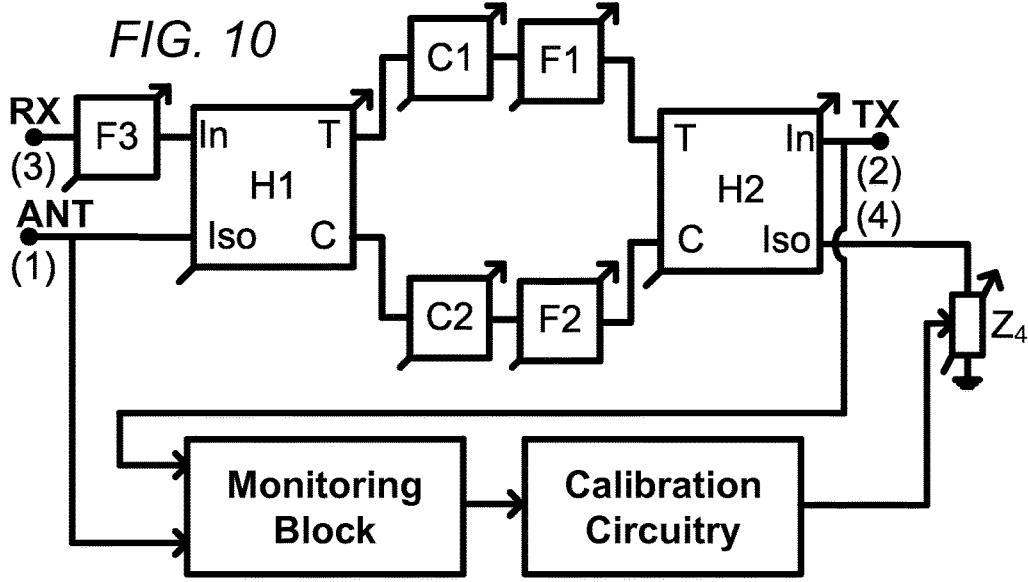
FIG. 10 illustrates an embodiment of an enhanced hybrid-based cancellation scheme with tunable blocks and correction circuitry that includes a monitoring block and a calibration circuitry that may be used to adjust C1, C2, and $Z_4$ to achieve a desired performance.

FIG. 10 illustrates another embodiment of an enhanced hybrid-based cancellation scheme where multiple tunable or reconfigurable components may be used to enhance the performance or functionality or robustness, such as improving the isolation, increasing the frequency coverage, or increasing the robustness to environmental variations. For example, a wideband or multi-band duplexer that is robust to antenna impedance mismatch and component mismatches may be realized.

The value for each variable, tunable, or reconfigurable component may be set manually, or automatically using a sense-and-feedback (calibration) scheme, or using a look-up table, or any other appropriate method. Sensing can be performed at one or more of ports 1, 2, 3, and 4. Foreground or background calibration schemes may be used for the sense and feedback scheme. Sensing may be based on specific signals or signals that are naturally present including noise.

In the presence of antenna mismatch, a portion of signal from the TX port that should ideally go to the ANT port may be reflected back to TX port and a portion of it may go to RX port. The portion of the TX signal that enters the RX port may be cancelled by aforementioned reflection cancellation scheme. But, the reflected signal to the TX port may not be cancelled. This reflection may cause undesired effects, such as reducing the reliability or power efficiency of transmitter circuits such as the power amplifier, or even cause instabilities in the transmitter circuits.

Figure 11:
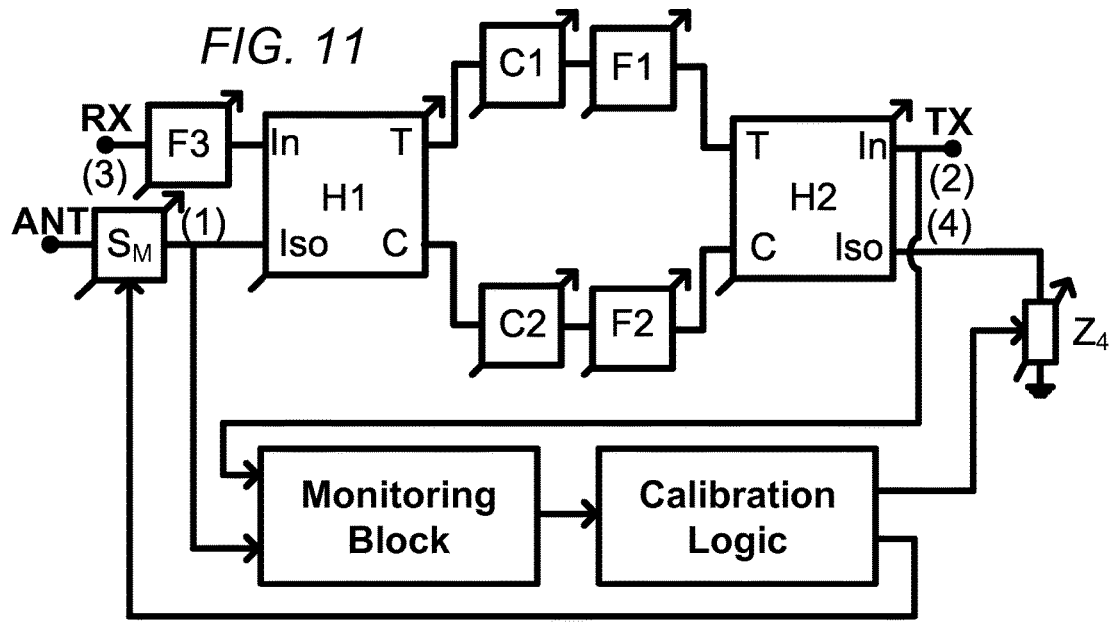
FIG. 11 illustrates an embodiment of an enhanced hybrid-based cancellation scheme that includes two variable two-port networks, C1 and C2, added between the two hybrid couplers, a variable impedance $Z_4$ added to a forth port, and a two-port network $S_M$ added at an antenna port to collectively improve the duplexer performance in the presence of various imperfections. Correction circuitry that includes a monitoring block and calibration circuitry that may be used to adjust C1, C2, $Z_4$, or $S_M$ to achieve a desired performance is also shown.

FIG. 11 illustrates an embodiment of an enhanced hybrid based cancellation network where variable two-port networks C1 and C2 may beadded in between the hybrids, a variable impedance $Z_4$, may be at port 4, and a variable two-port network $S_M$, may be at port 1. The two-port network $S_M$ may reduce the reflections from antenna. The remaining reflection going to RX port may be cancelled by creating cancelling reflections at port 4 using $Z_4$. The two-port network $S_M$ may be tunable along with or independent from other blocks in the hybrid cancellation scheme. Antenna tuning may be realized using passive components, such as capacitors, inductors, or transmission lines.

Figure 12:
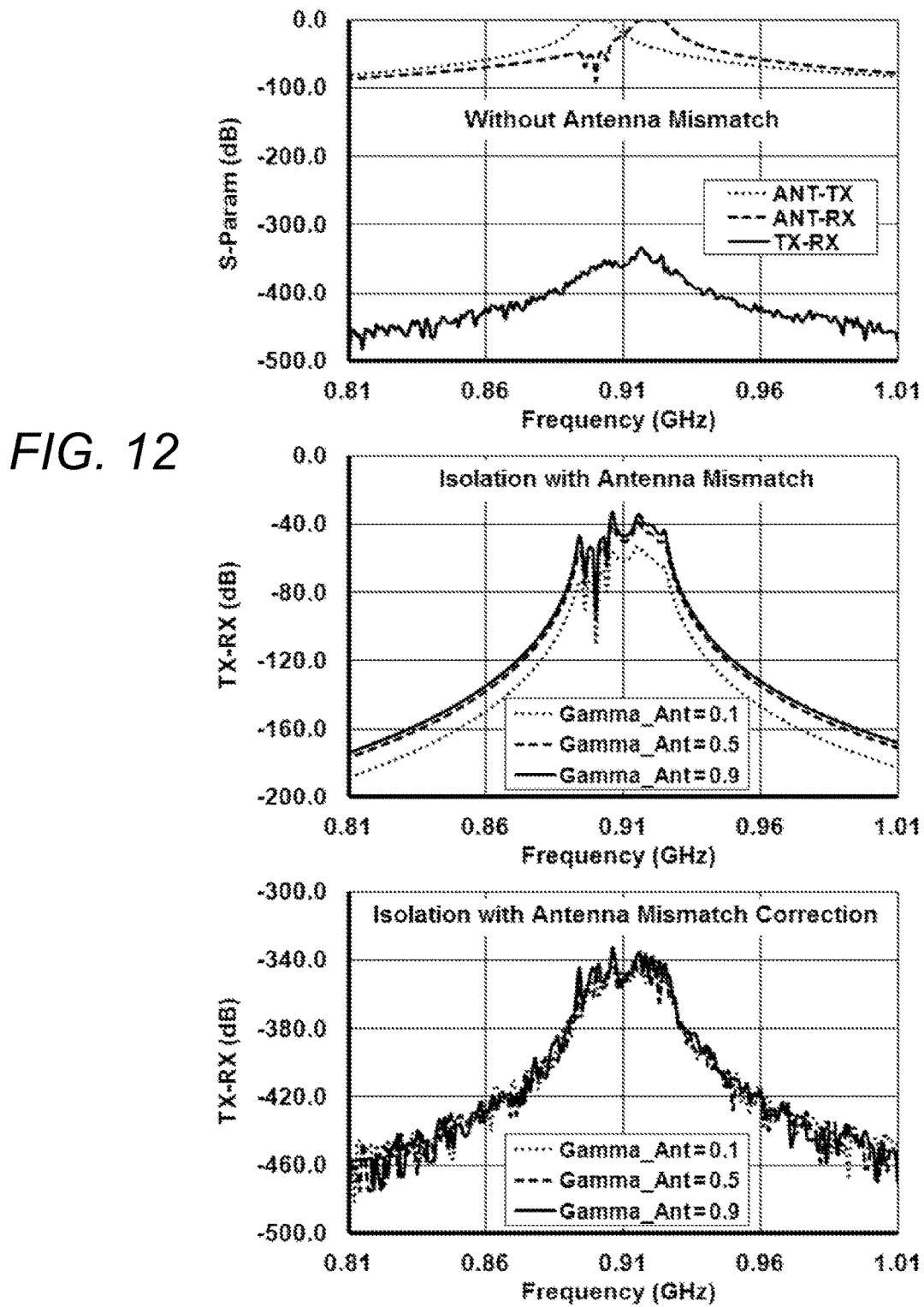
FIG. 12 shows illustrative simulations for the embodiment described in FIG. 3 for narrowband operation.

FIG. 12 shows illustrative simulations for the embodiment described in FIG. 3. Here, F1 and F2 are BPF filters centered at 0.9 GHz with 10 MHz bandwidth and F3 is a BPF centered at 0.92 GHz with 10 MHz bandwidth. Without antenna mismatch, the isolation between TX and RX ports is very high. The isolation may be severely deteriorated when antenna mismatch is introduced. After applying the antenna mismatch correction of FIG. 3, the isolation between TX and RX is enhanced significantly to a similar level than the case without any antenna mismatch.

Figure 13:
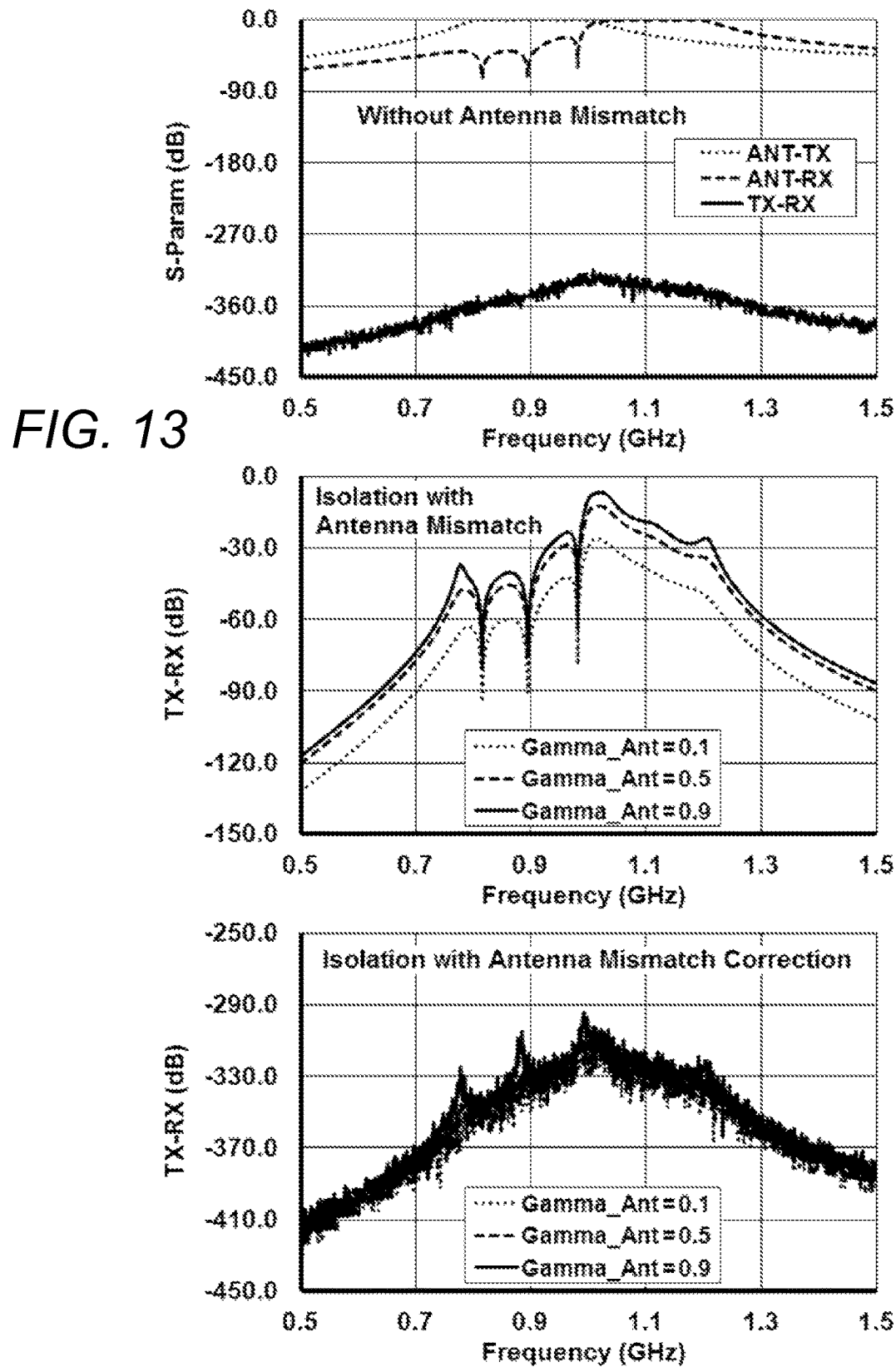
FIG. 13 shows illustrative simulations for the embodiment described in FIG. 3 for wideband operation.

FIG. 13 shows illustrative simulations for the embodiment of FIG. 3 where the bandwidths of the filters are higher compared with those of FIG. 8. Once again, isolation between TX and RX that is deteriorated with antenna mismatch is improved significantly thanks to the proposed scheme.

Figure 14:
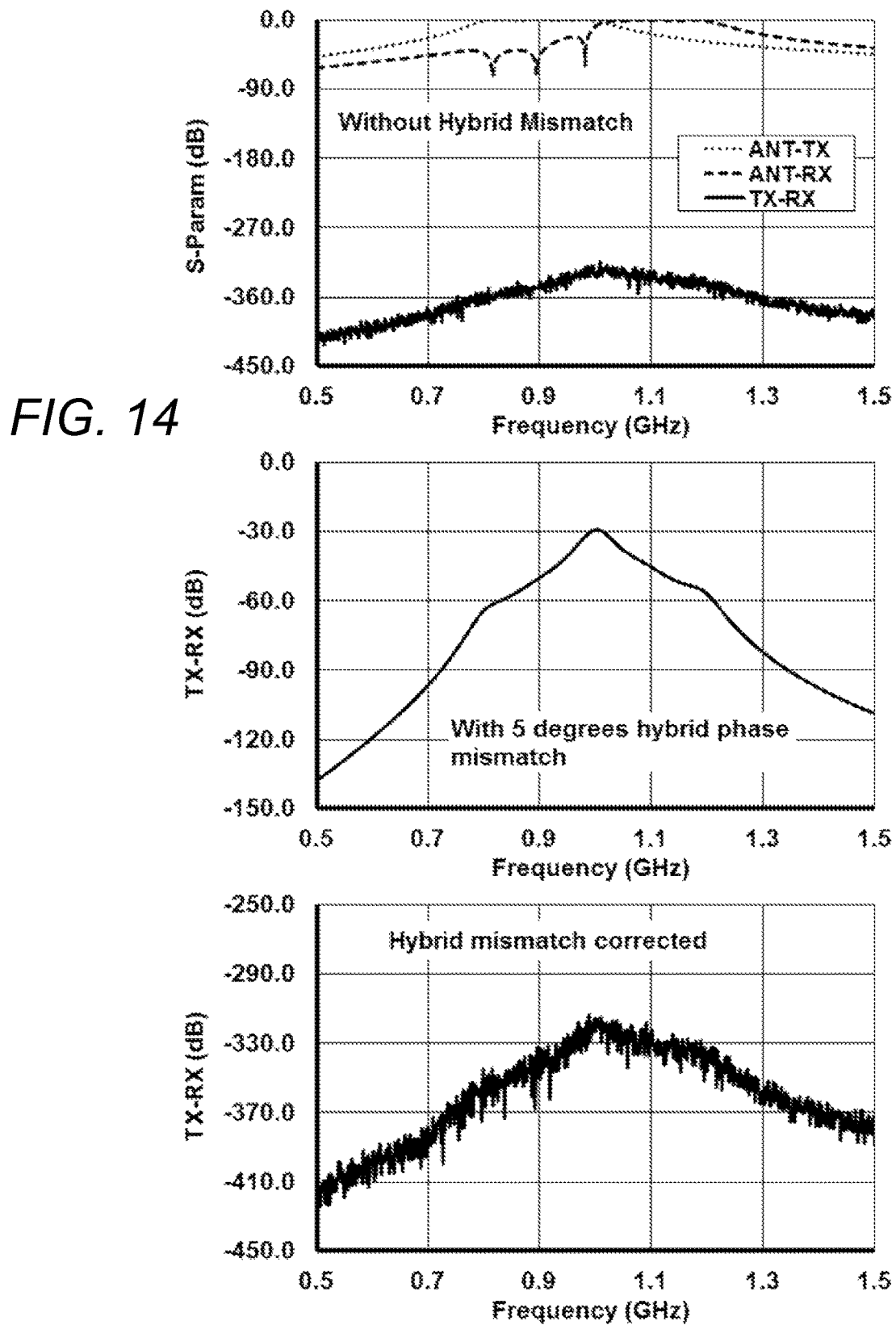
FIG. 14 shows illustrative simulations for the embodiment described in FIG. 6.

FIG. 14 shows illustrative simulations for the embodiment of FIG. 6. The top graph shows simulated performance of a hybrid based cancellation scheme in the absence of component mismatches. A high isolation between the TX and RX ports can be seen. The middle graph shows that the TX to RX isolation is degraded with component mismatches in simulations. The bottom graph shows that the TX to RX isolation, in the presence of component mismatches, is improved once two-port networks C1 and C2 are added.

While the specific illustrations show TX and RX with single passband, the teachings of this disclosure are applicable to cases where TX or RX or both include multiple passbands. Applications may include carrier aggregation, multi-band operation, multi-mode operation, or multi-standard operation. In these cases, some or all of the components within the scheme may be designed to include multiple passbands.

Various components of the various approaches disclosed herein may be realized as integrated circuits. Some or all of the components used in these approaches may be realized monolithically on the same substrate.

Some or all of the components used in these approaches may be integrated alongside other circuits as a part of a larger system. For instance, some or all of the components used in these approaches may be integrated with transceiver components of a wireless communication system. For instance, some or all of the components used in these approaches may be integrated with a receiver, transmitter, or transceiver as a monolithic integrated circuit such as those based on CMOS, BiCMOS, or BJT technologies. For instance, some or all of the components used in these approaches may be integrated with a receiver, transmitter, or transceiver on the same package. For instance, some or all of the components used in these approaches may be integrated with a receiver, transmitter, or transceiver on the same substrate or printed circuit board.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A multi-port hybrid-based cancellation network comprising
   a first hybrid coupler having a first port, a second port, a third port, and a fourth port;
   a second hybrid coupler that is distinct from the first hybrid coupler, the second hybrid coupler having a fifth port, a sixth port, a seventh port, and an eighth port;
   a first two-port network connected between the first port of the first hybrid coupler and the fifth port of the second hybrid coupler;
   a second two-port network that is distinct from, but essentially similar to the first two-port network, connected between the second port of the first hybrid coupler and the sixth port of the second hybrid coupler;
   a third two-port network that is distinct from the first and the second two-port networks connected to the third port of the first hybrid coupler;
   an antenna having an antenna impedance connected to the fourth port of the first hybrid coupler; and
   a load having a load impedance connected to the eighth port of the second hybrid coupler, the load having a load reflection coefficient matched to the antenna impedance with a phase that is 180° different than that of the antenna impedance at bandpass frequencies of the first two-port network and the second two-port network.

2. The multi-port hybrid-based cancellation network of claim 1 further comprising one or more other circuit components, at least one of which is connected to at least one port of one of the first hybrid coupler, the second hybrid coupler, the first two-port network, the second two-port network, and the third two-port network, in a configuration that:

reduce a signal reflection coefficient in at least one of the ports of the multi-port hybrid-based cancellation network; or increase signal isolation between at least two of the ports of the multi-port hybrid-based cancellation network.

3. The multi-port hybrid-based cancellation network of claim 2 wherein the one or more other circuit components have a tunable transfer function.

4. The multi-port hybrid-based cancellation network of claim 3 wherein the tunable transfer function can be adjusted to minimize the signal reflection coefficient or maximize signal isolation.

5. The multi-port hybrid-based cancellation network of claim 4 wherein the tunable transfer function is automatically adjusted by one or more additional circuitry components.

6. The multi-port hybrid-based cancellation network of claim 3 wherein the tunable transfer function can be adjusted based on a sensed condition.

7. The multi-port hybrid-based cancellation network of claim 6 wherein the sensed condition includes noise.

8. The multi-port hybrid-based cancellation network of claim 2 wherein the one or more other circuit components include one or more variable or fixed attenuators.

9. The multi-port hybrid-based cancellation network of claim 2 wherein the one or more other circuit components include one or more variable or fixed phase shifters.

10. The multi-port hybrid-based cancellation network of claim 2 wherein the one or more other circuit components include one or more variable or fixed delay elements.

11. The multi-port hybrid-based cancellation network of claim 2 wherein the one or more other circuit components include an impedance matching network.

12. The multi-port hybrid-based cancellation network of claim 2 wherein the one or more other circuit components reduce the signal reflection coefficient.

13. The multi-port hybrid-based cancellation network of claim 12 wherein at least one of the first hybrid coupler, the second hybrid coupler, the first two-port network, the second two-port network, the third two-port network, or the one or more other circuit components can be adjusted to reduce the signal reflection coefficient.

14. The multi-port hybrid-based cancellation network of claim 2 wherein the one or more other circuit components increase signal isolation.

15. The multi-port hybrid-based cancellation network of claim 14 wherein at least one of the first hybrid coupler, the second hybrid coupler, the first two-port network, the second two-port network, the third two-port network, or the one or more other circuit components can be adjusted to increase signal isolation.

16. The multi-port hybrid-based cancellation network of claim 1 wherein at least one of the first two-port network, the second two-port network, the third two-port network, is tunable.

17. The multi-port hybrid-based cancellation network of claim 1 wherein the multi-port hybrid-based cancellation network operates effectively within multiple frequency bands.

18. The multi-port hybrid-based cancellation network of claim 2 wherein at least some of the one or more other circuit components, the first hybrid coupler, the second hybrid coupler, the first two-port network, the second two-port network, and the third two-port network are part of a single integrated circuit.

19. The multi-port hybrid-based cancellation network of claim 2 wherein at least some of the one or more other circuit components, the first hybrid coupler, the second hybrid coupler, the first two-port network, the second two-port network, and the third two-port network are part of a single substrate.

20. The multi-port hybrid-based cancellation network of claim 2 wherein the multi-port hybrid-based cancellation network includes a port having a configuration that is appropriate to connect to a transmitter, a port having a configuration that is appropriate to connect to a receiver, and a port having a configuration that is appropriate to connect to an antenna.

21. The multi-port hybrid-based cancellation network of claim 20 wherein the one or more other circuit components reduce the signal reflection coefficient of the port that is appropriate to connect to the antenna.

22. The multi-port hybrid-based cancellation network of claim 20 wherein the one or more other circuit components increase signal isolation between the port that is appropriate to connect to the receiver and the port that is appropriate to connect to the transmitter.

23. The multi-port hybrid-based cancellation network of claim 1 wherein all or some of the components are integrated with a receiver, a transmitter, or a transceiver.

24. The multi-port hybrid-based cancellation network of claim 1 wherein the load is variable.

25. The multi-port hybrid-based cancellation network of claim 2 wherein one or more of the one or more other circuit components is connected between the first port of the first hybrid coupler and the first two-port network.

26. The multi-port hybrid-based cancellation network of claim 25 wherein one or more of the one or more other circuit components include tunable phase shifters, tunable attenuators, tunable delay elements, or combinations thereof.

27. The multi-port hybrid-based cancellation network of claim 25 further comprising a monitoring block and a calibration block, the monitoring block being connected to the fourth port of the first hybrid coupler and the seventh port of the second hybrid coupler and providing an input to the calibration block, the calibration block providing values to automatically set the one or more of the one or more other circuit components.

28. The multi-port hybrid-based cancellation network of claim 2 wherein one or more of the one or more other circuit components have a value that varies as a function of changes in an impedance that is presented to one of the ports of the multi-port hybrid-based cancellation network.

29. The multi-port hybrid-based cancellation network of claim 1 further comprising a monitoring block and a calibration circuitry, the monitoring block being connected to the fourth port of the first hybrid coupler and the seventh port of the second hybrid coupler and providing an input to the calibration block, the calibration circuitry adjusting the load impedance.

30. The multi-port hybrid-based cancellation network of claim 1 wherein reflected signals from the load cancel reflections from the antenna when they combine at the seventh port.

31. The multi-port hybrid-based cancellation network of claim 1 further comprising:
 a first circuit component having a tunable transfer function interposed between the first two-port network and the first port of the first hybrid coupler; and
 a second circuit component having a tunable transfer function interposed between the second two-port network and the second port of the first hybrid coupler.

32. The multi-port hybrid-based cancellation network of claim 31 further comprising a monitoring block and a calibration circuitry, the monitoring block being connected to the fourth port of the first hybrid coupler and the seventh port of the second hybrid coupler and providing an input to the calibration block, the calibration circuitry adjusting the load impedance, the first circuit component having a tunable transfer function, and the second circuit component having a tunable transfer function.

\* \* \* \* \*